United States Patent

Ichikawa et al.

[11] Patent Number: 5,905,301
[45] Date of Patent: May 18, 1999

[54] MOLD PACKAGE FOR SEALING A CHIP

[75] Inventors: Seiji Ichikawa; Tomoaki Hirokawa; Tomoaki Kimura; Junichi Tanaka; Taku Sato; Satoshi Murata; Tsutomu Kubota; Takeo Ogihara; Kenji Uchida, all of Tokyo, Japan

[73] Assignee: NEC Corporation, Tokyo, Japan

[21] Appl. No.: 08/792,394

[22] Filed: Feb. 3, 1997

[30] Foreign Application Priority Data

Feb. 1, 1996 [JP] Japan .................................. 8-016680

[51] Int. Cl.⁶ ........................... H01L 23/04; H01L 23/10; H01L 29/82; H01L 23/08
[52] U.S. Cl. ........................... 257/676; 257/704; 257/698; 257/696; 257/666; 257/692
[58] Field of Search ................................... 257/666, 676, 257/787, 780, 778, 737, 692, 698, 667, 669, 696, 704; 29/827; 438/123; 174/524; 361/813

[56] References Cited

U.S. PATENT DOCUMENTS

| | | | |
|---|---|---|---|
| 5,091,772 | 2/1992 | Kohara et al. | 257/692 |
| 5,493,151 | 2/1996 | Asada et al. | 257/686 |
| 5,497,032 | 3/1996 | Tsuji et al. | 257/710 |
| 5,604,363 | 2/1997 | Ichihashi | 257/274 |
| 5,610,442 | 3/1997 | Schneider et al. | 257/778 |

FOREIGN PATENT DOCUMENTS

| | | | |
|---|---|---|---|
| 54-22770 | 2/1979 | Japan | 257/666 |
| 56-62344 | 5/1981 | Japan | 257/666 |
| 58-134449 | 8/1983 | Japan | 257/778 |
| A59-43526 | 3/1984 | Japan . | |
| A62-98751 | 5/1987 | Japan . | |
| 62-135441 | 8/1987 | Japan . | |
| 63-293962 | 11/1988 | Japan | 257/698 |
| 64-11356 | 1/1989 | Japan . | |
| 1-80058 | 3/1989 | Japan | 257/704 |
| 2-25057 | 1/1990 | Japan . | |
| 4-150057 | 5/1992 | Japan | 257/698 |
| A5-55303 | 3/1993 | Japan . | |
| 5-226548 | 9/1993 | Japan . | |
| 5-291319 | 11/1993 | Japan . | |
| 6-61365 | 3/1994 | Japan | 257/778 |
| 6-61383 | 3/1994 | Japan | 257/778 |
| 7-122692 | 5/1995 | Japan . | |
| WO9417552 | 8/1994 | WIPO . | |

OTHER PUBLICATIONS

Patent Abstracts of Japan, Abstract of JP-A 8–055927.
Patent Abstracts of Japan, Abstract of JP-A 6–069366.
Patent Abstracts of Japan, Abstract of JP-A 63–322452.
Patent Abstracts of Japan, Abstract of JP-A 57–010954.
Patent Abstracts of Japan, Abstract of JP-A 61–128551.
Patent Abstracts of Japan, Abstract of JP-A 59–169161.
Patent Abstracts of Japan, Abstract of JP-A 03–030362.

*Primary Examiner*—Tom Thomas
*Assistant Examiner*—Alexander Oscar Williams
*Attorney, Agent, or Firm*—Sughrue, Mion, Zinn, Macpeak & Seas, PLLC

[57] ABSTRACT

A package of the present invention comprises a base molded integrally with a lead frame by resin, a chip mounted on the lead frame, and a cap made of resin, which covers the chip and is fixed to the base. The base includes a substrate portion sealing the lead frame therein, a frame-shaped bank portion formed at a periphery of an upper surface of said substrate portion, the bank portion having said lead frame interposed between it snd the substrate portion, and an anchor portion formed at a portion of the lead frame interposed between the substrate portion and the bank portion. The chip is mounted on a region of the lead frame surrounded by the bank portion. The cap is fixed to the bank portion.

16 Claims, 16 Drawing Sheets

MOLD PACKAGE FOR SEALING A CHIP

BACKGROUND OF THE INVENTION

1. Field of the Invention

The present invention relates to a package, more particularly to a mold package which seals a chip mounting an ultra high frequency semiconductor, an optical element, a surface elastic wave element, a resonator, or the like.

2. Description of the Related Art

In an ultra high frequency device, when a size of its package becomes larger, an inductance component of a lead becomes larger, whereby a loss in a high frequency becomes larger. Therefore, the ultra high frequency device must be housed in a package which is as small as about 2 mm diameter. Furthermore, the ultra high frequency device has been heretofore incorporated in a ceramic hollow package. However, the ceramic package is high in cost so that the ultra high frequency device has a tendency to be incorporated in a resin mold package.

Since resin has a high dielectric constant, a parasitic capacitance becomes high when the whole of the device is sealed by resin. A high frequency gain of the device can not be obtained. To solve such a problem, a resin mold package in which a space is provided on a surface of the device has been proposed.

For example, in a gazette No. WO94/17552, disclosed is a high frequency plastic package having a structure that a semiconductor chip is mounted on a lead frame, a substrate portion made of resin mounting the lead frame on its surface is covered with a plastic cap, whereby the semiconductor chip is sealed. Furthermore, in Japanese Patent Application Laid Open No. Heisei 2-25057, disclosed is a method of manufacturing a semiconductor device wherein after molding a resin case having an opening at its upper portion integrally with a lead frame having an inner lead portion at its inner bottom, the inner lead portion and a semiconductor chip are connected to each other, and a cover for sealing the semiconductor chip is adhered to the resin case.

Furthermore, in Japanese Patent Application Laid Open No. Heisei 5-291319, disclosed is a semiconductor device wherein a pad of a semiconductor chip and a metal foil are connected through a connection projecting electrode, the metal foil being formed on a flexible film substrate, a frame-shaped dam pattern is formed either outside the projecting electrode or inside it, and by interposing the semiconductor chip and the flexible film substrate using a resin sheet for sealing, both of the chip and the substrate are integrally fixed to each other. In Japanese Utility Model Application Laid Open No. Showa 62-135441, disclosed is a flip chip mounting structure wherein a flip chip having a solder bump formed thereon is connected onto a substrate provided with a plurality of electrodes thereon, and a space having a height equal to the solder bump is formed between the substrate and the flip chip by dropping resin onto the flip chip from a direction above the flip chip.

However, in the high frequency plastic package disclosed in the WO94/17552 gazette, since a bending working for the lead frame is conducted after sealing the plastic cap, there are problems that due to stress applied at the lead frame bending working, the lead frame moves over the mold, the plastic cap is cracked, or an adhered portion is peeled off whereby the plastic cap is detached.

On the other hand, in the manufacturing method of the semiconductor device disclosed in the Japanese Patent Application Laid Open No. Heisei 2-25057, an outer periphery of the opening serves as a frame portion, and the lead frame is held between a base portion and a frame portion. Therefore, the above-described problems hardly occur. However, in general, electronic parts are initially mounted at a specified position of a printed circuit board and the like by a handler of a mounting machine and is soldered to the printed circuit board. Further, the printed board is partially sealed with a sealing case or the printed circuit board is attached to a case of a body.

During these processes, a portion of the handler, the sealing case, or a driver sometimes touches inadvertently the package which has been already mounted on the substrate. In the case of a comparatively large package, it is possible to form the frame so as to have a thick thickness, so that the package is never broken when the handler and the like touches the package.

However, in a case of packages for a ultra high frequency device, since its diameter is about 2 mm, a thickness of the frame is as small as about 0.5 mm. Therefore, with an application of a slight shearing stress in a lateral direction to the package, there is a possibility of breakdown of the package.

In the semiconductor device disclosed in the Japanese Patent Application Laid Open No. Heisei 5-291319, since the flexible film or the resin sheet is used as a main body, there is a problem that the package itself has a poor mechanical strength. Furthermore, the package is distorted by an application of pressure at sealing, and there is a possibility that resin flows into the inside of the package from a small space of the dam pattern, thereby reducing reliability of the device. In the mounting structure disclosed in the Japanese Utility Model Application Laid Open No. howa 62-135441, the dropped resin spreads into the periphery of the semiconductor chip, so that a problem of flowing of the resin still remains. Furthermore, unless optimization for a viscosity of the resin and for a space between the substrate and the semiconductor chip are done, the space between the substrate and the semiconductor chip is not always formed.

SUMMARY OF THE INVENTION

The present invention is to provide a package which has an excellent high frequency characteristic and is capable of bearing with automatic mounting, even when adopting a resin for the package.

To achieve the foregoing object, a package of the present invention comprises:

a base including a lead frame, a substrate portion sealing said lead frame therein, a frame-shaped bank portion formed at an outer periphery of an upper surface of said substrate portion, said bank portion having said lead frame interposed between it and the substrate portion, and an anchor portion formed in a portion of said lead frame interposed between said substrate portion and said bank portion, said substrate portion and said bank portion being molded integrally with said lead frame by resin;

a chip electrically connected to said lead frame and mounted on a region of said lead frame on said base, said region being surrounded by said bank portion; and a cap made of resin covering the said chip, said cap being fixed onto said bank portion.

As described above, the chip is mounted on the region of the lead frame surrounded by the bank portion of the base made of resin, and the cap made of resin is fixed to the bank portion. Thus, obtained is a resin mold hollow package in which the chip is sealed in a hollow portion formed by the base and the cap. In such package, an anchor portion is formed at a position of the lead frame interposed between the substrate portion and the bank portion, whereby intensity of the package is enhanced in spite of the resin mold hollow package.

The anchor portion may be an anchor hole formed in the lead frame, which connects the substrate portion to the bank portion. Furthermore, a blade portion, jagged stripes, or a nail portion is formed in the lead frame in addition to the anchor hole, whereby pulling-up strength of the lead frame is enhanced.

Furthermore, a package of the present invention comprises:

a base including a lead frame, a substrate portion sealing said lead frame therein, and a framed-shaped bank portion formed on an upper surface of said substrate portion, said bank portion having said lead frame interposed between it and said substrate portion, and said substrate portion and said bank portion being formed integrally with said lead frame by resin;

a chip electrically connected to said lead frame and mounted on a region of said lead frame on said base, said region being surrounded by said bank portion; and a cap made of resin covering the said chip, said cap being fixed onto said bank portion, wherein said bank portion is arranged inside an inner wall of said cap and said cap is fixed to an edge of said substrate portion and an outer wall surface of said bank portion.

Also with the package constituted as described above, obtained is a resin mold hollow package in which the chip is sealed in a hollow portion between the base and the cap. In addition, since the cap is fixed to the outer periphery of the substrate portion and the outer wall surface of the bank portion, the intensity of the package itself is reinforced by the bank portion, and the fixing intensity is increased. Moreover, when the cap is fixed to the base, the bank portion serves as a guide for the cap, so that the positioning accuracy is increased.

Furthermore, a package of the present invention comprises:

a base including a lead frame and a substrate portion sealing said lead frame therein, said substrate portion being formed integrally with said lead frame;

a chip mounted on a portion of said lead frame disposed on said base, said chip being electrically connected to said lead frame; and a cap made of resin fixed to said base, said cap covering said chip, wherein said lead frame is drawn out from a side surface of said substrate portion and has a chip mounting portion for mounting said chip and a bonding portion electrically connected to said chip, said chip mounting portion and said bonding portion are bent so as to be exposed to a surface of said substrate portion.

Also in the package constituted as described above, obtained is a resin mold hollow package in which the chip is sealed in a hollow portion between the base and the cap. Moreover, the lead frame is held in the substrate portion in the state where it is bent to display a crank shape, whereby the pulling-up strength of the lead frame increases. Particularly, by making the upper surface of the base flat, removal of resin flashes occurring in the chip mounting portion and boding portion of the lead frame at the time of molding the base are facilitated.

Furthermore, a package of the present invention comprises:

a base including a lead frame, a substrate portion sealing said lead frame therein, and a frame-shaped bank portion formed at a periphery on an upper surface of said substrate portion, which interposes said lead frame with said substrate portion, and said substrate portion and said bank portion being formed integrally with said lead frame by resin; and a chip mounted on a region, surrounded by said bank portion, in said lead frame on said base, said chip being electrically connected to said lead frame, wherein said chip having a plurality of projection electrodes on its electrode formation surface facing said lead frame is connected to said lead frame and said chip is sealed with dropped resin, and a space is provided between said chip and said substrate portion.

In the package constituted as described above, since the lead frame is connected to the chip having the electrode formation surface provided with the projection electrodes facing the lead frame, obtained is a resin mold hollow package in which a space is formed between the electrode formation surface of the chip and the lead frame. In addition, since the inside of the bank portion is filled with a sealing resin, the intensity of the package itself increases.

BRIEF DESCRIPTION OF THE DRAWINGS

For a more complete understanding of the present invention and the advantages thereof, reference is now made to the following description taken in conjunction with the accompanying drawings, in which.

DETAILED DESCRIPTION OF THE PREFERRED EMBODIMENTS

Embodiments of the present invention will be described with reference to the accompanying drawings.

(First Embodiment)

A package of the first embodiment of the present invention will be described with reference to FIGS. 1(a) and 1(b).

Figure 1A:
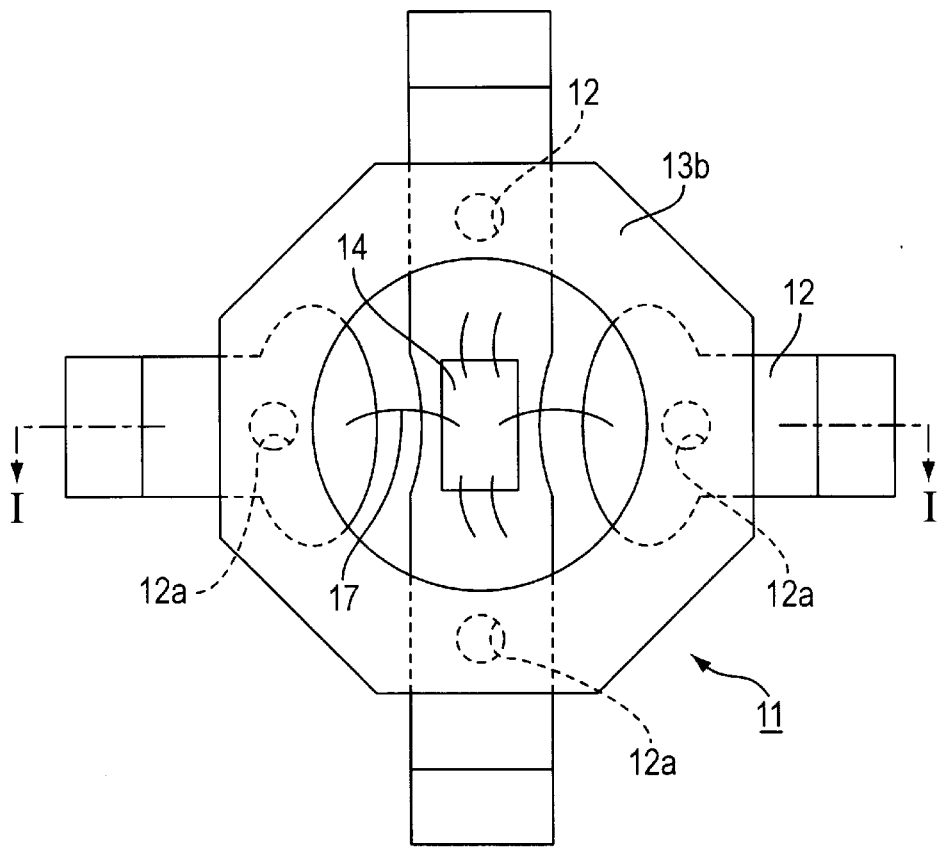
FIG. 1(a) is a plan view showing a package of a first embodiment of the present invention before sealing with a cap.
Figure 1B:
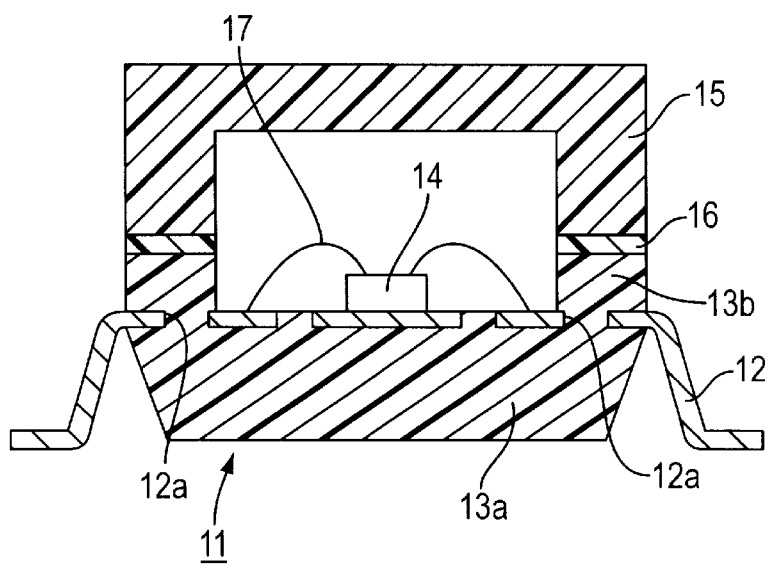
FIG. 1(b) is a sectional view taken along the line I—I of FIG. 1(a) showing the package of the first embodiment of the present invention after sealing with the cap.

Referring to FIGS. 1(a) and 1(b), the package of this embodiment consists of a base 11 including a lead frame 12, a chip 14 mounted on the base 11, and a cap 15 covering the chip 14, which is fixed to the base 11.

The base 11 consists of the lead frame 12, a substrate portion 13a sealing the lead frame 12, and a frame-shaped bank portion 13b interposing the lead frame 12 at a periphery of an upper surface of the base portion 13a, the bank portion 13b having the same outer shape as that of the base portion 13a. The base portion 13a and the bank portion 13b are made of resin, and they are formed integrally with the lead frame 12 by a metallic mold (not shown). Thus, the lead frame 12 is interposed between the base portion 13a and the bank portion 13b to be held. Anchor holes 12a for connecting the base portion 13a to the bank portion 13b are formed at the positions corresponding to the inner lead of the lead frame 12 between the base portion 13a and the bank portion 13b. Resin is filled in the anchor holes 12a by molding with the metallic mold.

Cu alloy or 42 alloy or the like is used as a material of the lead frame 12. Moreover, resin of epoxy type, liquid polymer (LCP), or polyphenylene sulfide (PPS) is used as a material of the resin portion of the base 11, or a material of the base portion 13a and the bank portion 13b.

The chip 14 is mounted on the lead frame 12 at a region surrounded by the bank portion 13b and is connected to the lead frame 12 electrically by a bonding line 17. The cap 15 is molded using the same resin as that of the base 11. The cap 15 is adhered to the upper surface of the bank portion 13b with an adhesive agent made of epoxy type resin or phenol type resin. Thus, obtained is a resin mold package having a hollow portion sealing the chip 14, the hollow portion being formed by the base 11 and the cap 15. Therefore, this package has an excellent high frequency characteristic although a resin package is employed. It should be noted that the resin portion of the base 11 may be formed of different resin from that of the cap 15. For example, the cap 15 may be formed of transparent resin when an optical device is used as the chip.

Dimensions of each portion of the package of this embodiment will be described below. In the resin portion of the base 11, a thickness of the substrate portion 13a is 0.3 mm, a width of the bank portion 13b is 0.35 mm, and a height thereof is 0.2 mm. In the lead frame 12, a width is 0.5 mm, a thickness is 0.12 mm, and a diameter of the anchor hole 12a is 0.2 mm. In the cap 15, a diameter is 1.9 mm, a height is 0.5 mm, a resin thickness is 0.3 mm.

Next, an example of a manufacturing method of the package will be described with reference to FIGS. 2(a) to 2(e).

Figure 2A:
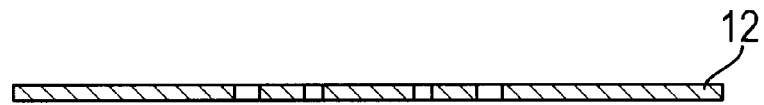
FIGS. 2(a) to 2(e) show a manufacturing method of the package shown in FIGS. 1(a) and 1(b)
Figure 2B:
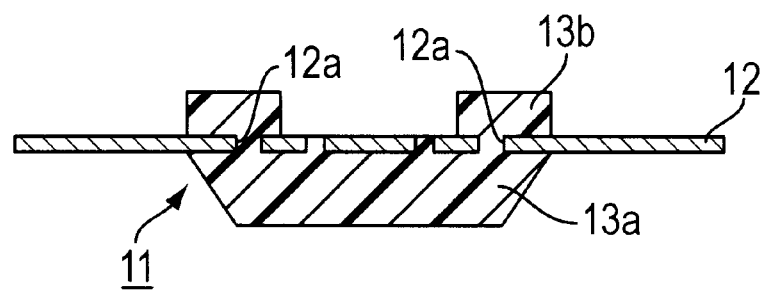
Figure 2C:
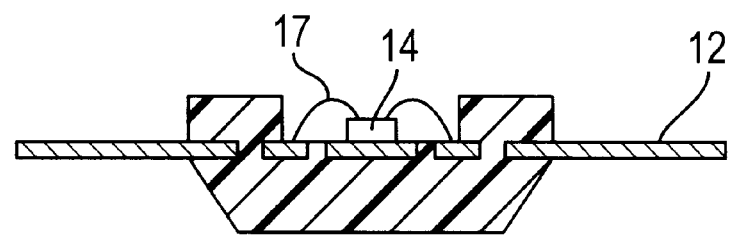

(a) The lead frame 12 is formed in a specified shape by press working or etching processing (FIG. 2(a)).

(b) The lead frame 12 is disposed within a cavity formed by the mold (not shown). Resin is injected into the cavity. Thus, the base 11 is formed which holds the lead frame 12 by its substrate portion 13a and bank portion 13b (FIG. 2(b)). At the time of injection of the resin to the cavity, the anchor hole 12a of the lead frame 12 is also filled with the resin. Also in this portion, the substrate 13a and the bank portion 13b are integrated with each other.

(c) The chip 14 is mounted on the lead frame 12. The lead frame 12 and the chip 14 are connected by the bonding line 17 (FIG. 2(c)).

Figure 2D:
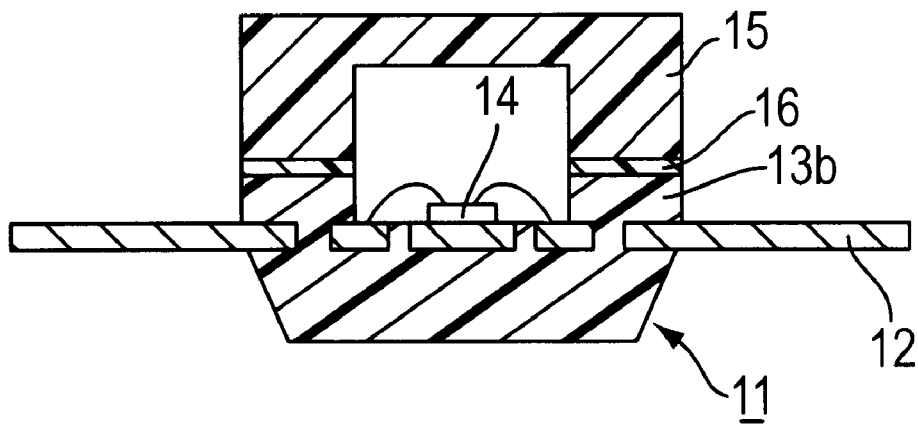

(d) Adhesive agent 16 is coated on the adhesion surface of the bank portion 13b where the cap 15 is adhered thereto, whereby the cap 15 is adhered to the upper surface of the bank portion 13b (FIG. 2(d)). As a result, the chip 14 is sealed within the hollow portion formed by the base 11 and the cap 15.

Figure 2E:
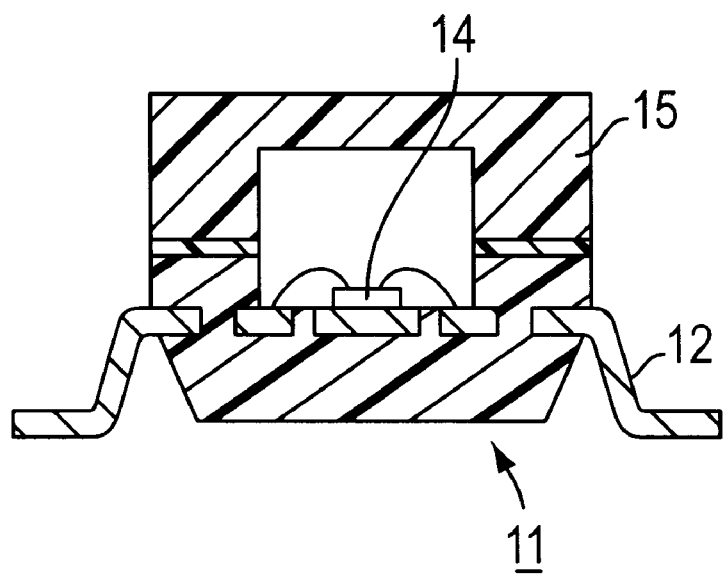

(e) The periphery portion of the lead frame 12 is cut, and the portion corresponding to the outer lead of the lead frame 12 is subjected to bending working (FIG. 2(e)).

The package is completed through the above-described steps.

Figure 15:
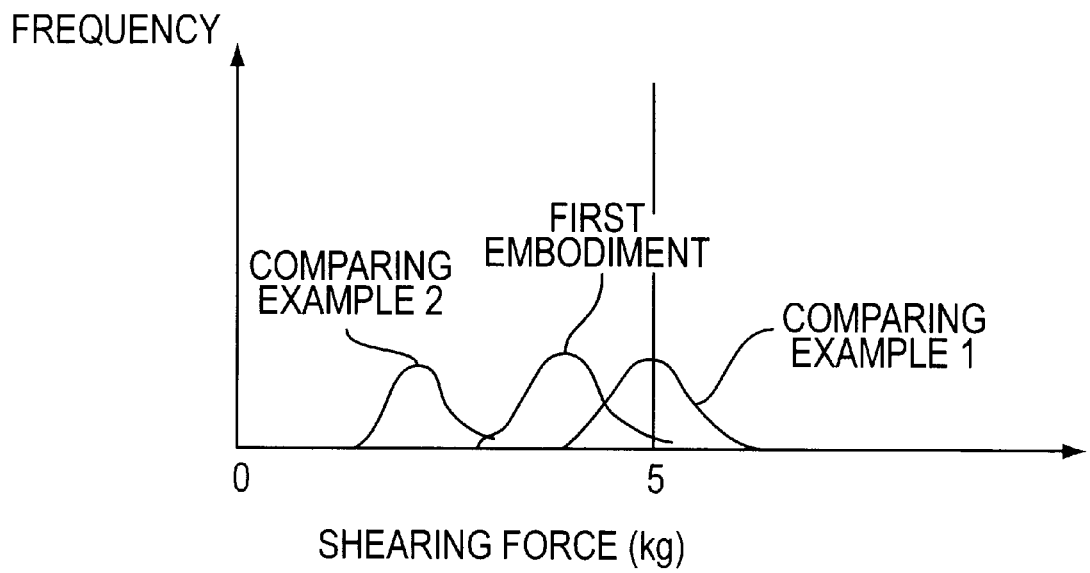
FIG. 15 is a graph showing a comparison of breaking shearing force of the package of the first embodiment with those of other embodiments.

Here, in the package of this embodiment, under the situation where the lead frame 12 was soldered onto the printed circuit board, a shearing force in a lateral direction was applied to the uppermost portion of the cap 15 by means of a push-pull gauge. The shearing force applied when the package was broken was measured. The number of test samples was 20, and the trend of the frequency distribution of the shearing force in this embodiment is illustrated in FIG. 15. For comparison, similar tests were conducted for the conventional package using the cap formed of ceramic (Comparing Example 1) and for the package constituted in the similar manner to this embodiment except that no anchor hole is formed in the lead frame (Comparing Example 2) The results are illustrated in FIG. 15 together with that of this embodiment.

As a result of the experiments, in the package of this embodiment, a breakdown of the package occurred at the bank portion, and the average of the shearing force at the time of the breakdown of the bank portion was 3.7 kg. Moreover, in the Comparing Example 1, a break-down occurred between an adhesive for adhering the cap and the lead frame, and the average of the shearing force at the time of the breakdown of that portion was 5 kg. In the Comparison Example 2, a breakdown occurred at the bank portion, and the average of the shearing force at the time of the breakdown of the bank portion was 2.2 kg. From the above results, it was found that the package has a strength nearly equal to that of the ceramic package by means of the anchor hole 12a even though that package is a resin mold hollow type package.

The formation of the anchor hole in the lead frame is disclosed also in Japanese Patent Application Laid Open No. Heisei 5-226548 and Heisei 7-122692.

Specifically, in the Japanese Patent Application Laind Open No. Heisei 5-226548, disclosed is the lead frame formed in the following manner. A hole having a semi-circle shaped section is formed in the surface of the inner lead portion by etching technique. Thereafter, a hole having a semi-circle shaped section is formed also in the rear surface of the inner lead portion. Both holes are connected thereby forming the anchor hole. However, this anchor hole serves to absorb the mechanical shock produced at the step for cutting the lead frame and the step for bending it, and also the package using the lead frame is not a hollow type one. Therefore, there is no necessity to apprehend the breakdown of the package due to contacting of the handler of the mounting machine with the package.

Moreover, in the Japanese Patent Application Laid Open No. Heisei 7-122692, disclosed is a semiconductor device having a structure that a lead frame is interposed between a base portion and a sealing portion constituting an envelop. An anchor hole is formed at the portion of the lead frame between the base portion and the sealing portion. Adhesive of glass type is filled in the anchor hole. In this situation, the lead frame is adhered to the base portion and the sealing portion. Moreover, the base portion and the sealing portion are made of ceramic. Thus, since the base portion and the sealing portion are made of ceramic, the lead frame is constructed so as to be interposed between the base portion and the sealing portion. Even though this structure was constructed by mold resin, peeling off of the adhered portion due to the stress applied at the lead frame bending working may happen so that floating of the lead frame from the adhered portion or detachment of the sealing portion occur, like the case of the foregoing WO94/17552 gazette. Accordingly, this structure is effective on the semiconductor package in which a large area is available for adhesion. However, this structure is not suitable for a small sized package for use in an ultra high frequency device.

(Second Embodiment)

Figure 3A:
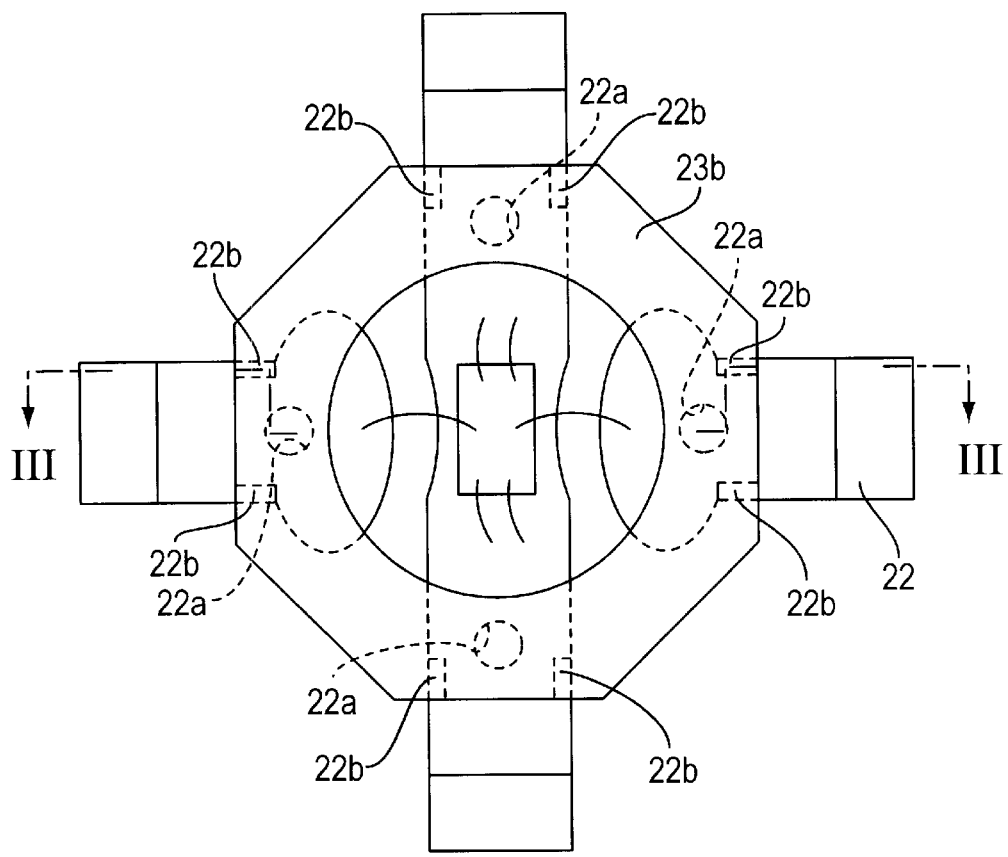
FIG. 3(a) is a plan view of a package of a second embodiment of the present invention before sealing with a cap.
Figure 3B:
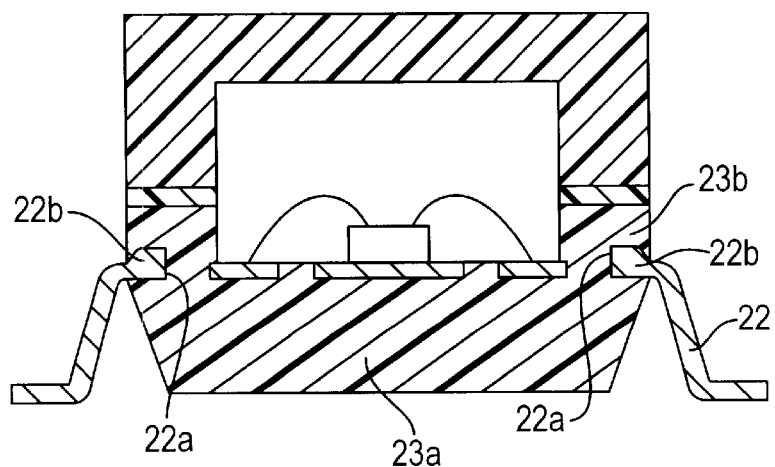
FIG. 3(b) is a sectional view taken along the line III—III of FIG. 3(a) showing the package of the second embodiment of the present invention after sealing with the cap.

A package of a second embodiment of the present invention will be described with reference to FIGS. 3(a) and 3(b).

In this embodiment, a blade portion 22b protruding in a thickness direction of the lead frame 22 is formed at the position between the substrate portion 23a and the bank portion 23b, in addition to the anchor hole 22a. The blade portion 22b is made by bending both side portions of the lead frame 22 corresponding to the foregoing position toward the bank portion 23b. In this embodiment, the length of the blade portion 22b shall be 0.15 mm, and the height thereof shall be 0.1 mm. Constitutions and materials of other portions of the package are the same as those of the first embodiment and the description for them are omitted.

Figure 4A:
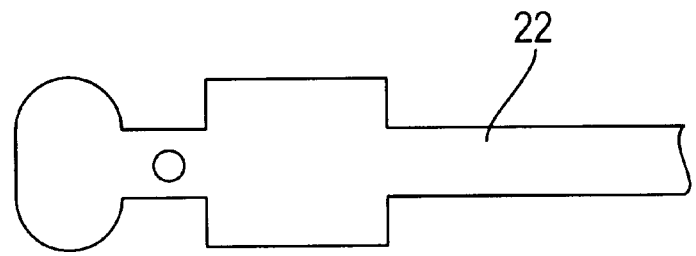
FIGS. 4(a) to 4(c) show a manufacturing method of the package show in FIGS. 3(a) and 3(b)
Figure 4B:
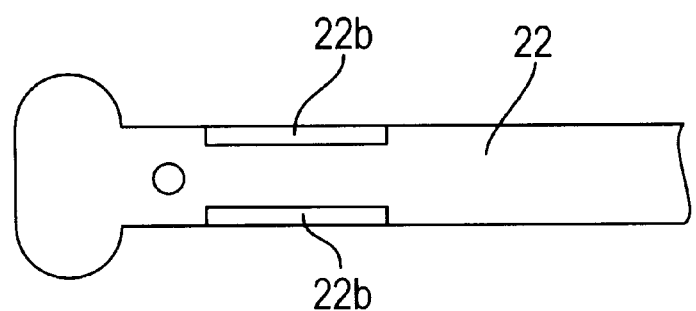
Figure 4C:
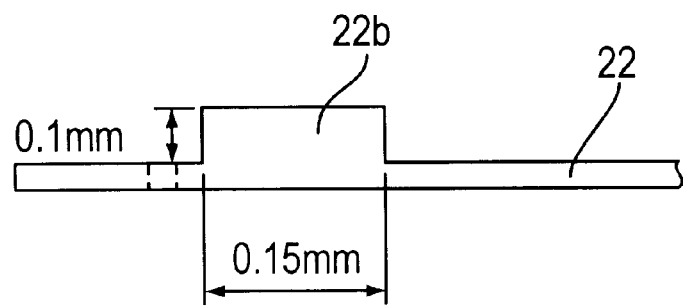

An example of a formation method of the blade portion 22b will be described with reference to FIGS. 4(a) and 4(c). First, the lead frame 22 is formed in a specified shape by press working or etching processing. At this time, the portion which serves as the blade portion 22b is made so as to be wider than other portions, as shown in FIG. 4(a). Subsequently, the wider portion is bent by press working. Thus, as shown in FIGS. 4(b) and 4(c), the blade portion 22b is formed in both sides of the lead frame 22.

As described above, the formation of the blade portion 22b in the lead frame 22 increases pulling-up strength of the lead frame 22. Particularly, the protrusion of the blade portion 22b into the bank portion 23b makes the contact area of the lead frame 22 with the bank portion 23b larger, whereby a strength against a shearing force applied to the lead frame is further increased. In the same manner as the first embodiment, the shearing force when the package is broken was measured. The value of the shearing force was 4.8 kg. It was found that the a resin mold hollow package having a strength closer to that of a ceramic package was obtained. It should be noted that when the blade portion 22b having a protrusion in a direction of the substrate portion 23a is formed, its pulling-up strength increases compared to the first embodiment although the strength against the shearing force is the same as the first embodiment.

(Third Embodiment)

Figure 5A:
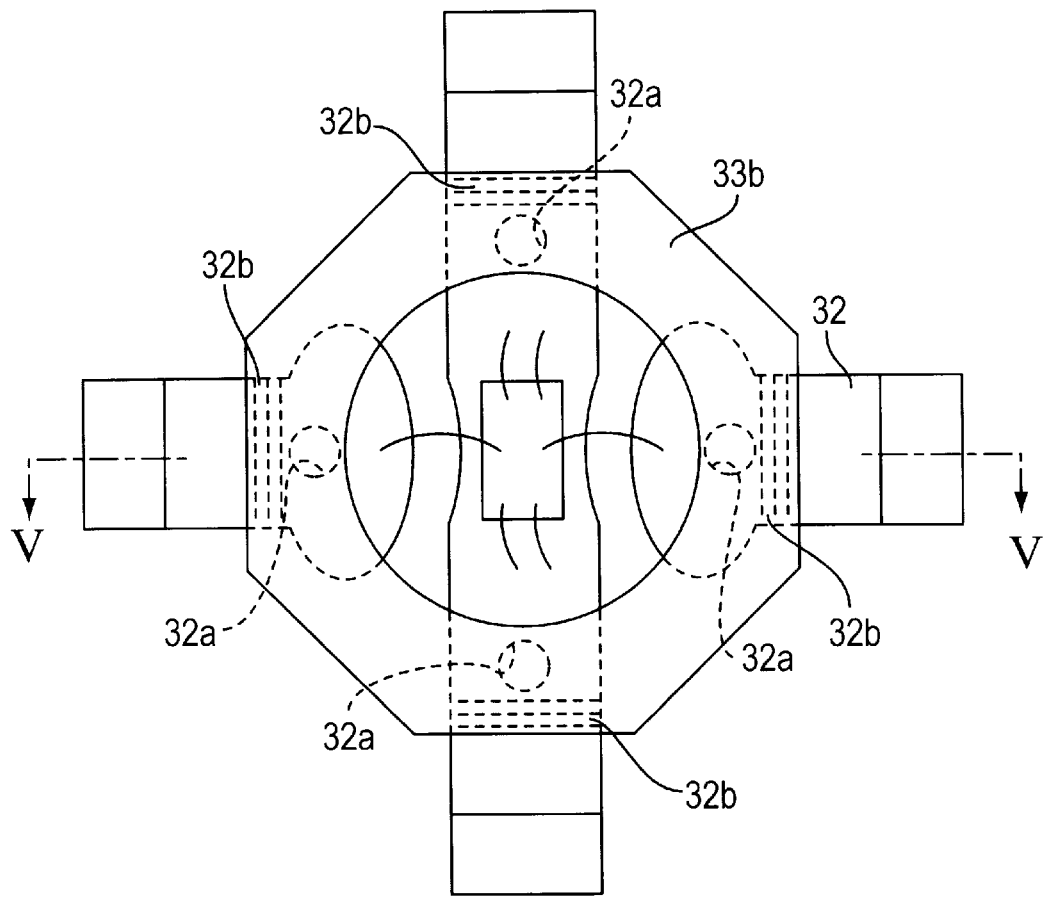
FIG. 5(a) is a plan view of a package of a third embodiment of the present invention before sealing with a cap.
Figure 5B:
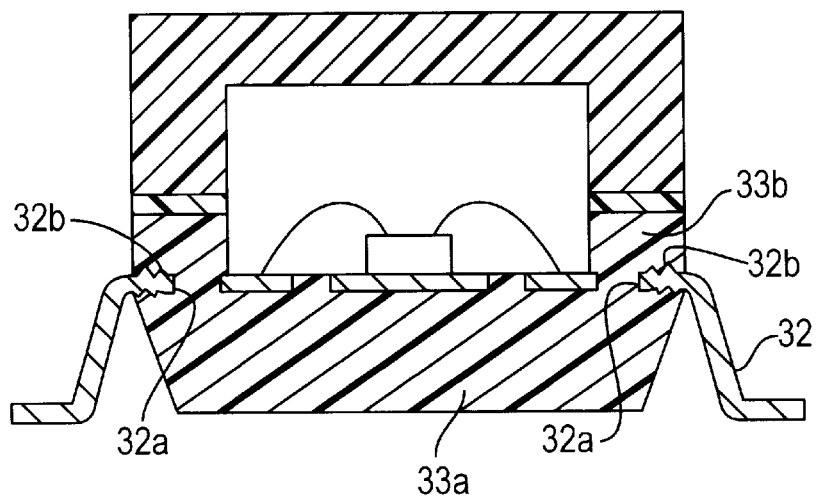
FIG. 5(b) is a sectional view taken along the line V—V of FIG. 5(a) showing the package of the third embodiment of the present invention after sealing with the cap.

A package of a third embodiment of the present invention will be described with reference to FIGS. 5(a) and 5(b).

Figure 6:
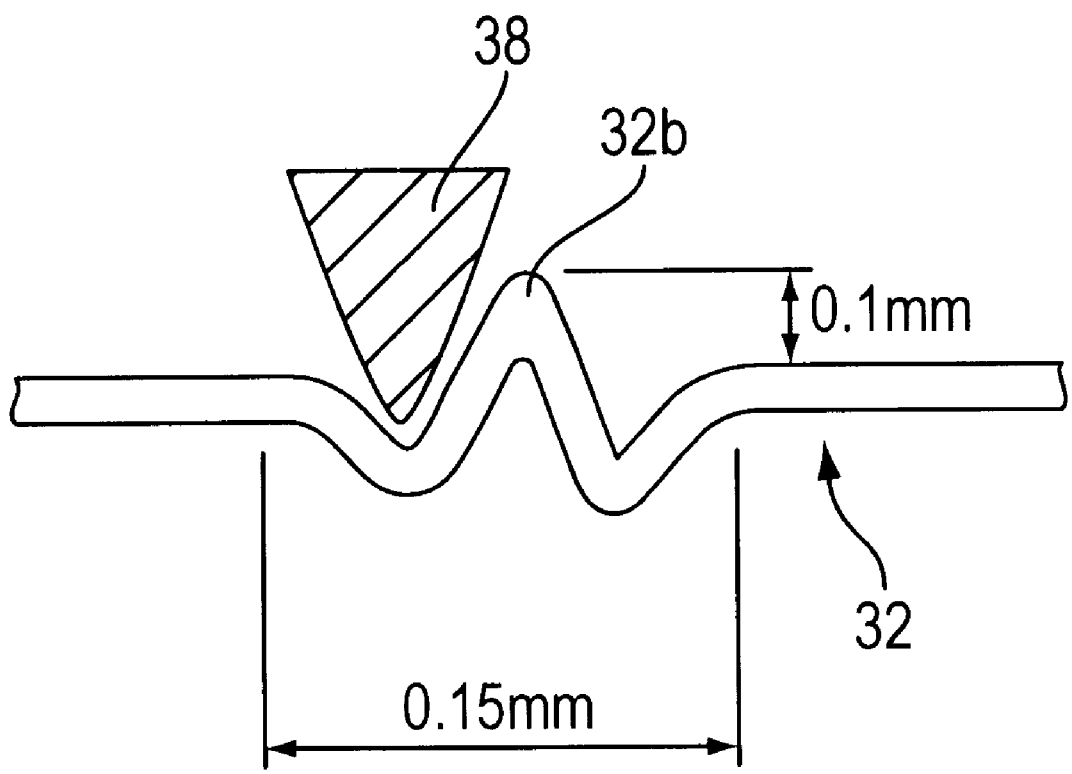
FIG. 6 is a schematic view showing a method for forming a lead frame of the package shown in FIGS. 5(a) and 5(b)

In the package of the third embodiment, the jagged stripes 32b are formed at the portion of the lead frame 32 interposed between the substrate portion 33a and the bank portion 33b, in addition to the anchor hole 32a. The jagged stripes 32b are constituted of tops and bottoms along the width direction of the lead frame 32, which are arranged alternately in the longitudinal direction of the lead frame 32. For a forming method of the jagged stripes 32b, there has been a method wherein after the formation of the lead frame 32 by press working in a specified shape in the same manner as the first embodiment, as shown in FIG. 6, the lead frame 32 is stamped by a punch 38 having the V-shaped top end. In this case, the length of the lead frame 32 becomes shorter because of the formation of the jagged stripes 32b. Therefore, the length of the lead frame must be determined considering this shortened amount when forming the lead frame 32 by the press working and so on. In this embodiment, the length of the jagged stripes 32b was set to be 0.15 mm, and the height of the jagged stripes 32b from the surface of the lead frame 32 was set to be 0.1 mm. Other constitutions and the materials of the lead frame 32 are the same as those of the first embodiment. Therefore, the descriptions for them are omitted.

As described above, the formation of the jagged stripes 32b enhances the pulling-up strength of the lead frame 32. Moreover, since the contact area of the lead frame 32 with the resin portion of the base is large, the strength of the package against the shearing force is more enhanced. The measurement of the shearing force at the time when the package is broken was conducted in the same manner as the first embodiment. The shearing force was 4.8 kg. Thus, it was proved that the resin mold hollow package having the strength closer to that of the ceramic package was obtained.

(Fourth Embodiment)

Figure 7A:
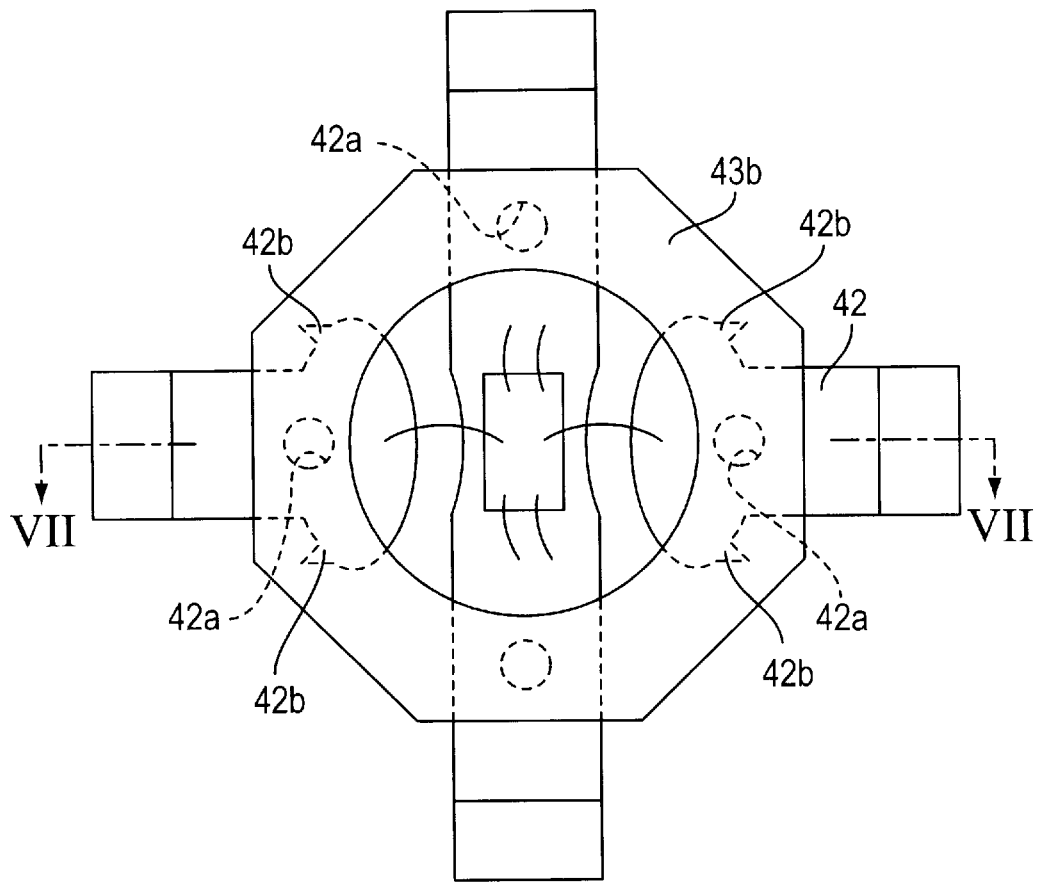
FIG. 7(a) is a plan view a plan view showing a package of a fourth embodiment of the present invention before sealing with a cap.
Figure 7B:
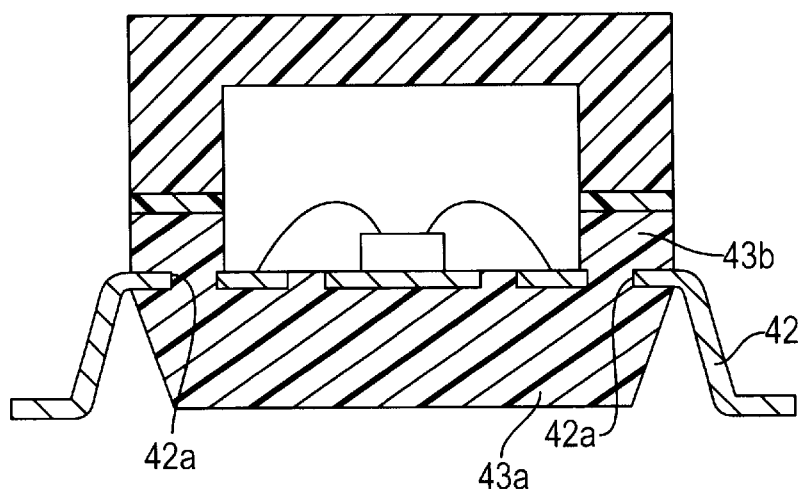
FIG. 7(b) is a sectional view taken along the line VII—VII of FIG. 7(a) showing the package of the fourth embodiment of the present invention after sealing with the cap.

A package of a fourth embodiment of the present invention will be described with reference to FIGS. 7(a) and 7(b).

In the package of this embodiment, a nail portion 42b is formed in each portion of the lead frame 42 interposed between the base portion 43a and the bank portion 43b, in addition to the anchor hole 42a. The nail portion 42b is formed integrally with each of both sides of the lead frames 42. The nails portion 42b displays a tapering wedge shape with a top end extending toward the outside of the base. The lead frame 42 having the nail portion 42b can be formed by press working or etching processing, similarly in the first embodiment. In this embodiment, the length and width of the nail portion 42b are set to be 0.2 mm, respectively. Other constitutions and materials of each portion of the package are the same as those of the first embodiment. The descriptions for them are omitted.

As described above, the formation of the nail portion 42b in the lead frame 42 enhances the pulling-up strength of the lead frame 42. Particularly, the foregoing wedge-shaped nail portion 42b enhances the pulling-up strength of the lead frame 42 more effectively.

Furthermore, it is possible to combine the anchor described in the second to fourth embodiments.

(Fifth Embodiment)

Figure 8A:
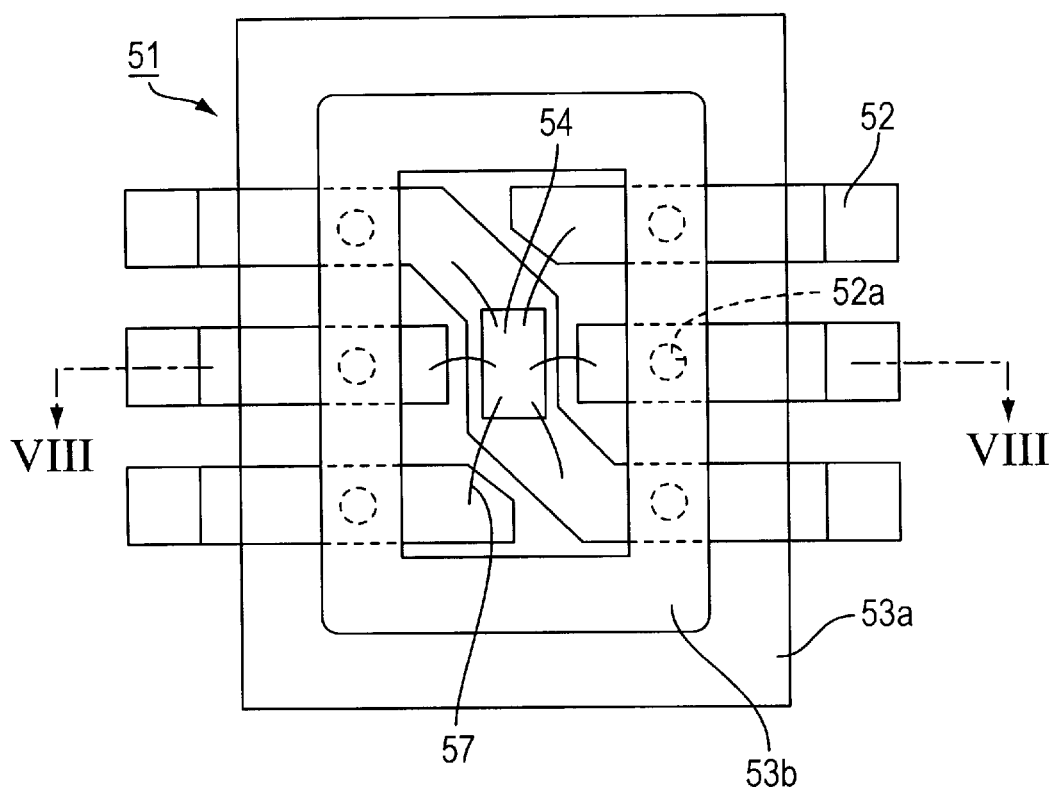
FIG. 8(a) is a plan view a plan view showing a package of a fifth embodiment of the present invention before sealing with a cap.
Figure 8B:
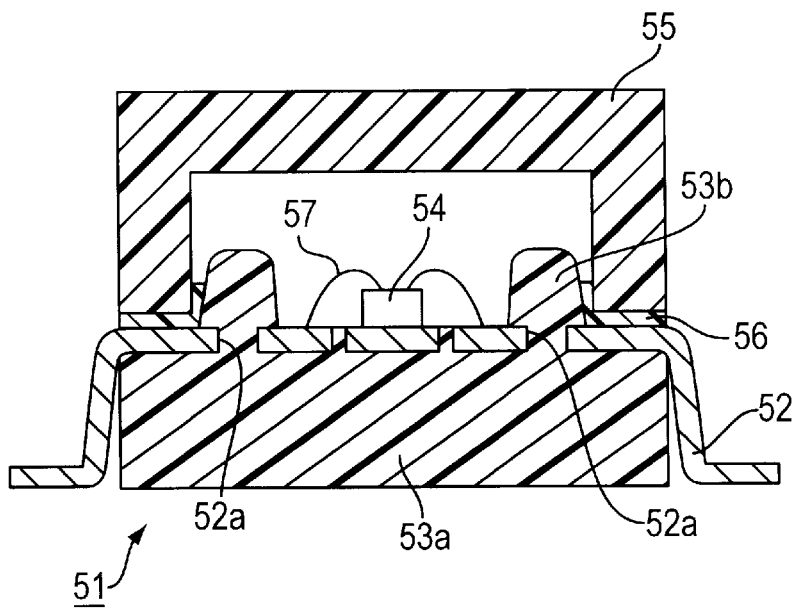
FIG. 8(b) is a sectional view taken along the line VIII—VIII of FIG. 8(a) showing the package of the fifth embodiment of the present invention after sealing with the cap.

A package of a fifth embodiment of the present invention will be described with reference to FIGS. 8(a) and 8(b).

The package of this embodiment of the present invention has a rectangular shape. A constitution thereof is principally similar to those of the foregoing embodiments. Specifically, the resin portion of the base 51 includes a substrate portion 53a sealing the lead frame 52, and a frame-shaped bank portion 53b formed on the upper surface of the substrate portion 53a so as to nip the lead frame 52. Moreover, an anchor hole 52a is formed at the position of each lead frame 52 interposed between the substrate portion 53a and the bank portion 53b. Resin is filled also in the anchor hole 52a. The chip 54 is mounted on the position of the lead frame 52 surrounded by the bank portion 53b. The chip 54 is electrically connected to the lead frame 52 by the bonding line 57. Then, the cap 55 is adhered to the upper surface of the base 51 by adhesive agent 56, whereby the chip 54 is sealed within the hollow space formed by the base 51 and the cap 55. The same materials as those of the foregoing embodiments are used to constitute each portion of the package.

The package of this embodiment is different from those of the foregoing embodiments in the following items. First, the bank portion 53b is arranged inside the inner wall of the cap 55. The cap 55 is adhered to the edge of the substrate portion 53a and the outer wall of the bank portion 53b. In this embodiment, the width of the bank portion 53b is set to be 0.35 mm and the height thereof is set to be 0.2 mm.

As described above, the bank portion 53b is arranged within the cap 55, and the cap 55 is adhered to the outer periphery of the substrate portion 53a and the outer wall of the bank portion 53b, whereby it is possible to increase the adhesion area and the adhesion strength. Moreover, it is possible to prevent the adhesive 56 from flowing into the hollow space. Moreover, the cap 55 is adhered onto the substrate portion 53a, whereby the total height of the package can be reduced by an amount equal to the height of the bank portion 53b, compared to the foregoing embodiments. To be concrete, the total height of the package of this embodiment is 1.3 mm, though the total height of the package of the foregoing embodiments was 1.5 mm.

In addition to the above-described advantages, the bank portion 53b serves as a guide for the cap 55 at the time of adhering the cap 55 to the bank portion 53b, whereby a positioning accuracy of the cap 55 for the base 51 is enhanced. Furthermore, the strength of the cap 55 against for the shearing force is reinforced by the bank portion 53b.

(Sixth Embodiment)

Figure 9A:
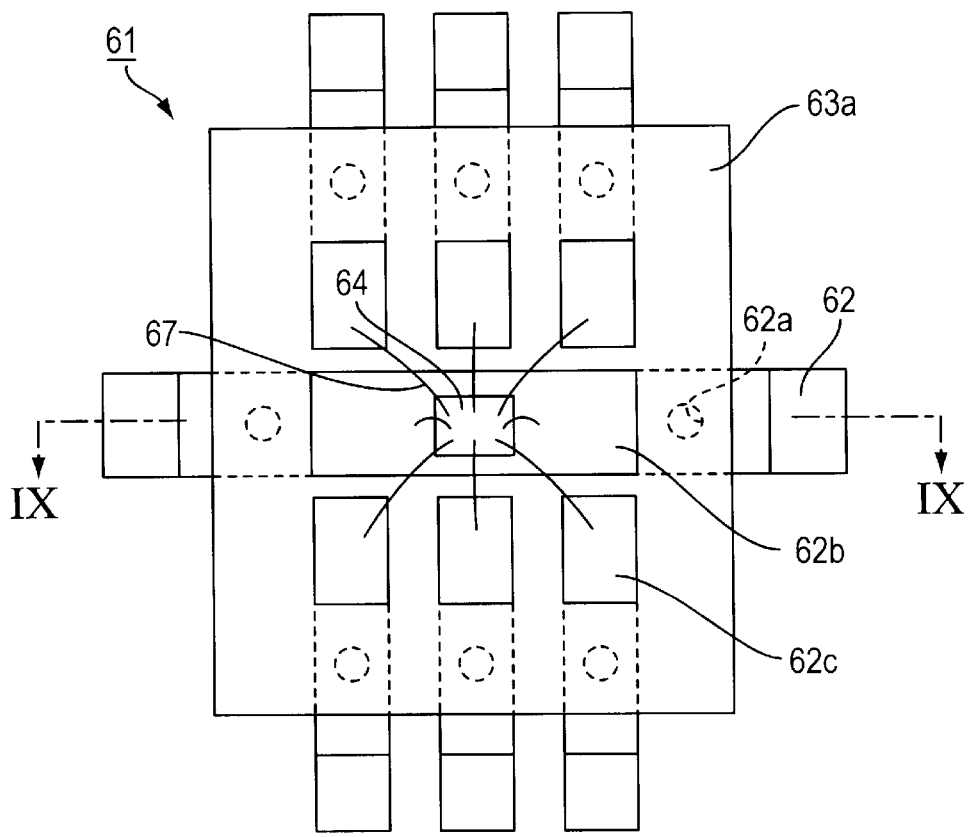
FIG. 9(a) is a plan view a plan view showing a package of a sixth embodiment of the present invention before sealing with a cap.
Figure 9B:
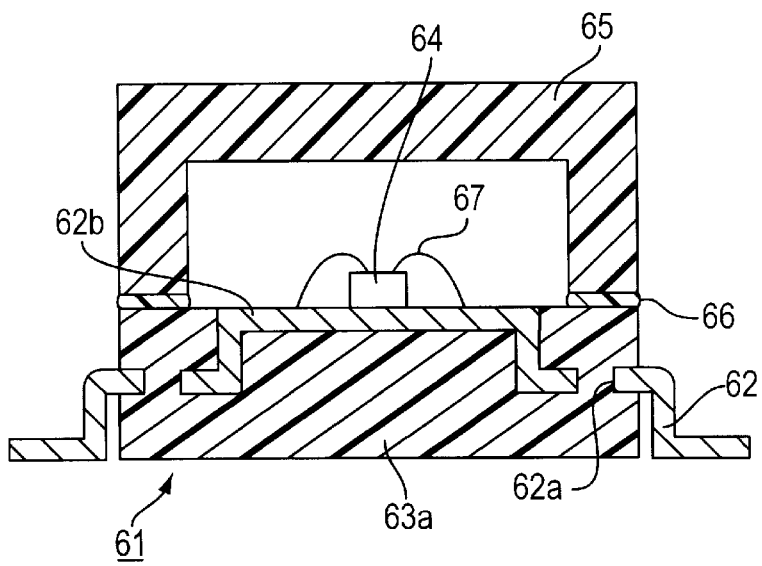
FIG. 9(b) is a sectional view taken along the line IX—IX of FIG. 9(a) showing the package of the sixth embodiment of the present invention after sealing with the cap.

A package of a sixth embodiment of the present invention will be described with reference to FIGS. 9(a) and 9(b).

In the package of this embodiment, the lead frame 62 has a chip mounting portion 62b mounting the chip 64 and a bonding portion 62c connected electrically to the chip 64 through the bonding line 67, both portions 62b and 62c being formed by bending the lead frame 62 in a convex shape. Thus, both portions 62b and 62c are exposed over the upper surface of the substrate portion 63a made of resin. The upper surface of the base 61 consisting of the substrate portion 63a and the lead frame 62 is flat. An anchor portion having an anchor hole 62a therein and serving as a part of the lead frame 62 buried in the substrate portion 63a is located at a lower position than the chip mounting portion 62b and the bonding portion 62c. The lead frame 62 is projected from the side surface of the substrate portion 63a.

Figure 10:
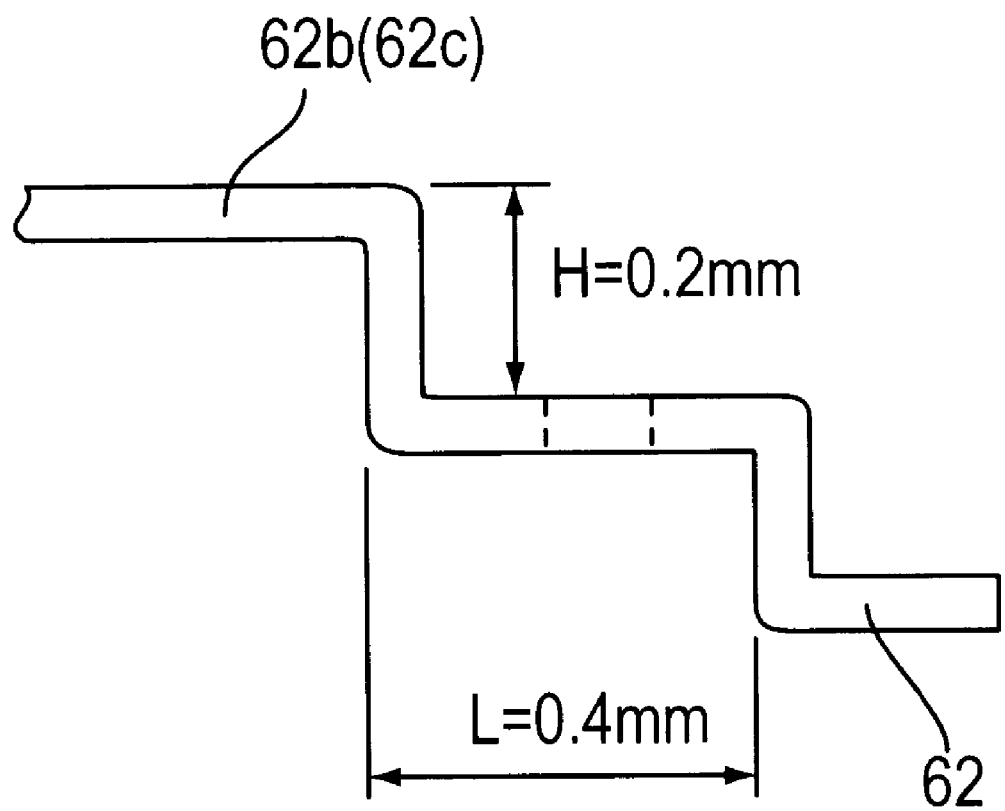
FIG. 10 is a figure showing dimensions of main parts of the lead frame shown in FIGS. 9(a) and 9(b)

As described above, the lead frame 62 is bent at its portion within the substrate portion 63a, the anchor portion is disposed in the substrate portion 63a, and the lead frame 62 is projected from the side surface of the substrate portion 63a. With such shape of the lead frame 62, the pulling-up strength of the lead frame 62 is enhanced. In this embodiment, the anchor hole 62a is not always necessary. It should be noted that concerning dimension of the major parts of the lead frame 62 of this embodiment, the heights H of the chip mounting portion 62b and the bonding portion 62c corresponding to the anchor portion are 0.2 mm, and the length L of the anchor portion is 0.4 mm, as shown in FIG. 10.

The cap 65 made of resin is adhered onto the upper surface of the substrate portion 63a by adhesive 66. Thus, obtained is the resin mold package in which the chip 64 is sealed within the hollow portion formed of the base 61 and the cap 65. Therefore, the package of this embodiment has an excellent high frequency characteristic though it adopts resin as its material. The same materials for the lead frame 62, the substrate portion 63a, the cap 55, and the adhesive 66 as those of the foregoing embodiments are used.

A manufacturing method of the package 61 of this embodiment will be described. First, in the same manner as in the first embodiment, the lead frame 62 is formed in a specified shape. Subsequently, the lead frame 62 is subjected to emboss working by pressing whereby the chip mounting portion 62b and the bonding portion 62c are made convex shaped. Then, the lead frame 62 is disposed within a cavity surrounded by a metallic mold (not shown) and resin is injected into the cavity. Thus, the substrate portion 63a and the lead frame 62 are integrated with each other whereby the base 61 is formed.

Here, since the base 61 is obtained by molding integrally the lead frame 62 with resin using the metallic mold, resin flashes may occur on the surface of the chip mounting portion 62b and the bonding portion 62c depending on a clearance between the metallic mold and the lead frame 62. When the resin flashes occur at these portions, mounting of the chip 64 will be difficult and connection of the chip 64 to the lead frame 62 will be impossible. The resin flashes must be removed before the chip 64 is mounted. In this embodiment, the upper surface of the base 61 is formed in a flat shape, so that the removal of the flashes is easy, and the flashes are completely removed even when the flashes occur on the upper surface of the base 61.

Figure 16:
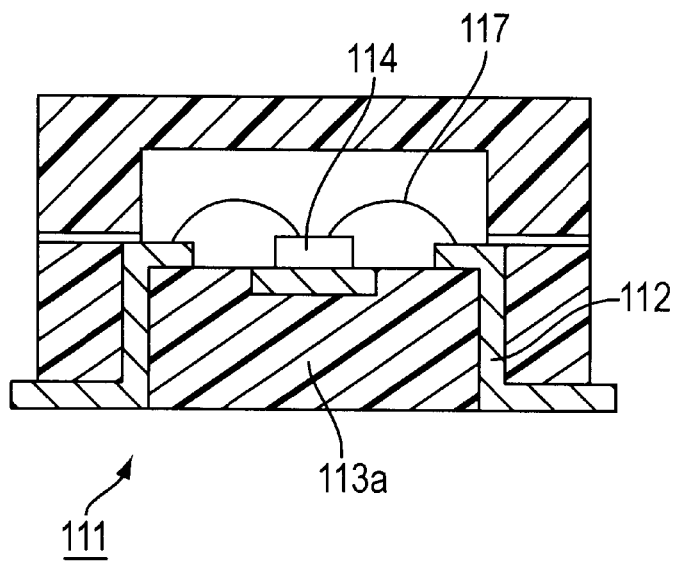
FIG. 16 is a sectional view of a conventional semiconductor package in which a base is constituted by integrating resin with a lead bent by a bending working in a crank shape.

In Japanese Patent Application Laid Open No. Shouwa 64-11356, a semiconductor package analogous to that of this embodiment is disclosed. This semi-conductor package has, as shown in FIG. 16, a base 111. The base 111 is an integrated body composed of a lead frame 112 and a substrate portion 113a, the integrated body being formed by molding the lead frame 112 with resin integrally. It is noted that the lead frame 112 is bent before molding of the lead frame 112 with resin. The uppermost portion of the lead frame 112 is exposed on the upper surface of the substrate portion 113a, and this exposed portion is connected to the chip 114 through the bonding line 117. The lowermost portion of the lead frame 112 is exposed on the bottom of the substrate portion 113a, and this exposed portion is soldered to a printed circuit board (not shown). Since the lead frame 112 is exposed in upper and bottom portions of the substrate portion 113a and an outer lead can not be nipped by a metallic mold as in this embodiment, resin flashes occur at both surfaces of the substrate portion 113a when the base 111 is molded. Therefore, in order to remove these resin flashes, working of removing the flashes must be conducted for the upper and bottom surfaces of the substrate portion 113a. However, in this embodiment, the working of removing the flashes only for the upper surface of the substrate portion 63a is required. Therefore, in this embodiment, the number of the workings of removing the flashes is reduced compared to the package shown in FIG. 16.

Moreover, since the package shown in FIG. 16 has such constitution that the portion of the lead frame soldered to the printed circuit board is fixed to the substrate portion 113a, expansion and contraction of the printed circuit board due to thermal change directly act on the substrate portion 113a when the printed circuit board is mounted on a semiconductor package. For this reason, a stress is applied to the substrate portion 113a so that cracks may occur in the substrate portion 113a. Contrary to the package shown in FIG. 16, in the package of this embodiment, the lead frame 62 is projected from the side surface of the substrate portion 63a. Moreover, the lead frame 62 is bent in its portion outside of the substrate portion 63a. The expansion and contraction of the printed circuit board can be absorbed by the outside of the substrate portion 63a, whereby the stress is not almost applied to the substrate portion 63a.

(Seventh Embodiment)

A package of a seventh embodiment of the present invention will be described with reference to FIGS. 11(a) and 11(b).

Figure 11A:
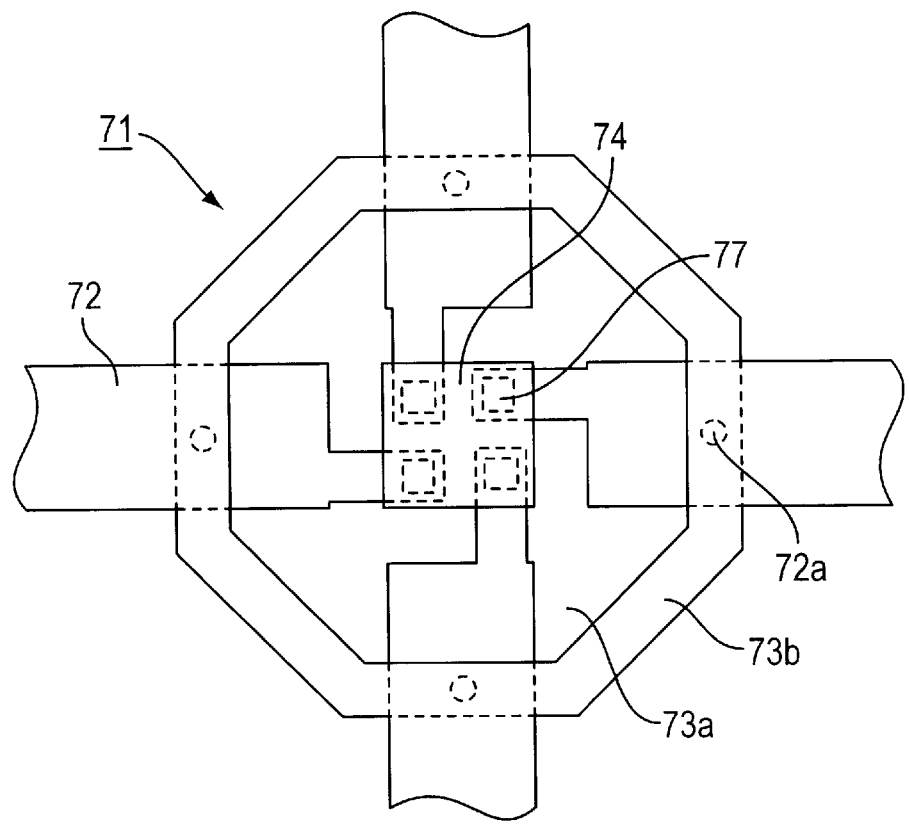
FIG. 11(a) is a plan view showing a package of a seventh embodiment of the present invention before dropping resin for sealing thereon.
Figure 11B:
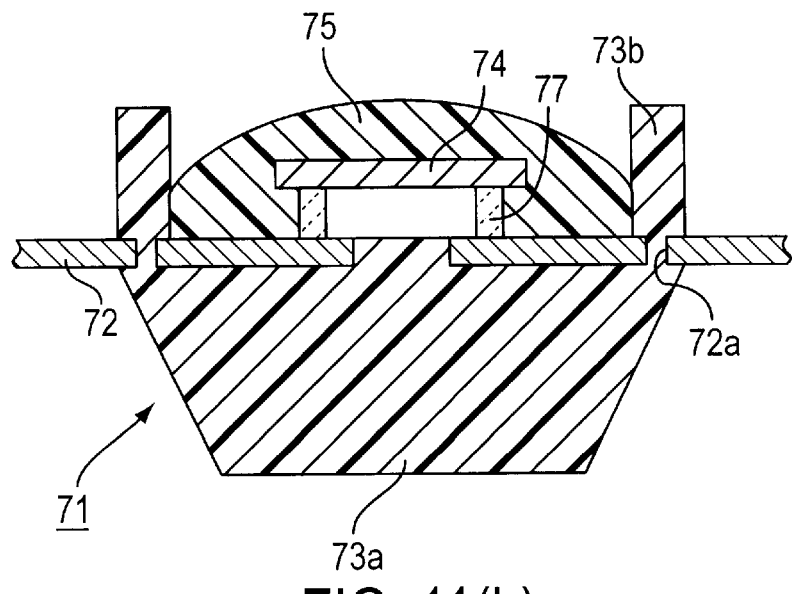
FIG. 11(b) is a sectional view showing the package of the seventh embodiment of the present invention after sealing by resin.

In FIGS. 11(a) and 11(b), the base 71 consists of the lead frame 72, the substrate portion 73a sealing the lead frame 72, and the bank portion 73b formed on the substrate portion 73a, whereby the lead frame 72 is interposed between the substrate portion 73a and the bank portion 73b. The bank portion 73b is formed on all of the outer periphery of the substrate portion 73a, the bank portion 73b displaying a frame-like shape. Both of the substrate portion 73a and the bank portion 73b are made of resin, and they are integrally molded together with the lead frame 72 by a metallic mold (not shown). Thus, the lead frame 72 is interposed between the substrate portion 73a and the bank portion 73b whereby the lead frame 72 is held by them.

The anchor hole 72a is formed in each portion of the lead frame 72 which is interposed between the substrate portion 73a and the bank portion 73b. Resin is filled also in the anchor hole 72a at the time of resin sealing using the metallic mold. The diameter of the anchor hole 72a should be 0.1 mm or more in order to fill resin in the anchor hole 72a securely. For this reason, the width of the bank portion 73b may be 0.1 mm or more. As described above, the reason why the width of the bank portion 73b can be reduced compared to the first embodiment is that the sealing resin 75 is filled in the region surrounded with the bank portion 73b, as described later, whereby the strength is ensured.

Furthermore, the bank portion 73b serves to hold the lead frame 72. Besides, the bank portion 73b is functions to prevent the sealing resin 75 from flowing out therefrom. For this reason, the bank portion 73b should be high enough for the sealing resin 75 not to flow out from the bank portion 73b. However, the height value varies according to an amount of the usage of the sealing resin 75 and it is not limited to that value.

The chip 74 is mounted on the region surrounded by the bank portion 73b. Moreover, the chip 74 is sealed with the sealing resin 75 which is dropped from the above in a liquid state. The sealing resin 75 fills the region surrounded by the bank portion 73b. The sealing resin 75 is solidified after being dropped. A plurality of projection electrodes 77 are formed on an electrode formation surface of the chip 74. Then, the electrode formation surface is placed upside down, and the lead frame 72 and the projection electrode 77 are connected.

The projection electrode 77 is set to be high enough such that the sealing resin 75 does not flow inside the projection electrode 77 when the sealing resin 75 is dropped down. Furthermore, a space is formed between the chip 74 and the substrate portion 73a. For example, when epoxy resin having viscosity of about 1000 cp is used as the sealing resin 75, the height of the projection electrode 77 must be 0.07 mm or less.

Figure 12A:
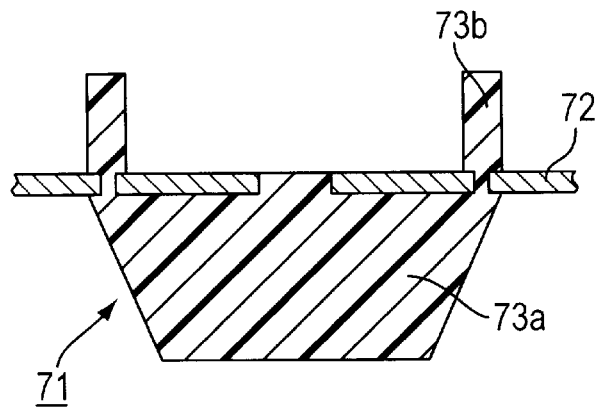
FIGS. 12(a) to 12(c) are figures showing a manufacturing method of the package shown in FIGS. 11(a) and 11(b)
Figure 12B:
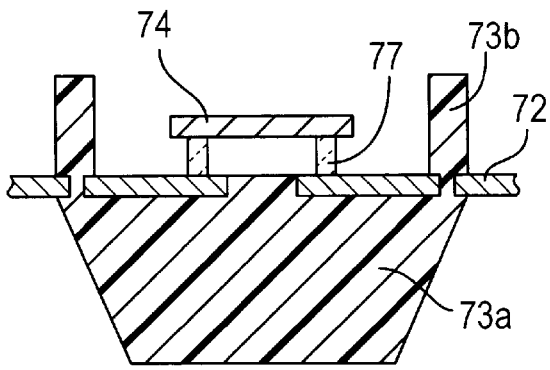

Next, an example of a manufacturing method of the package of this embodiment will be described with reference to FIGS. 12(a) to 12(c). First, the lead frame formed in a specified shape by a press working or an etching processing is disposed within a cavity of a metallic mold (not shown). Resin is injected into this cavity, whereby the base 71 composed of the substrate portion 73a, the bank portion 73b, and the lead frame 72 integrated with each other is formed (FIG. 12(a)).

Subsequently, a gold ball is formed on each of the projection electrodes 77 of the chip 74 by bonding. A gold wire for the formation of the gold ball may be one having a diameter of 20 μm which has been well used. Thereafter, the lead frame 72 is heated to temperature between 260° C. and 280° C. At this situation, the projection electrode 77 is directed downward, and the chip 74 is disposed above the lead frame 72. Subsequently, the projection electrode 77 and the lead frame 72 are thermally bonded by compressing (FIG. 12(b)).

Figure 12C:
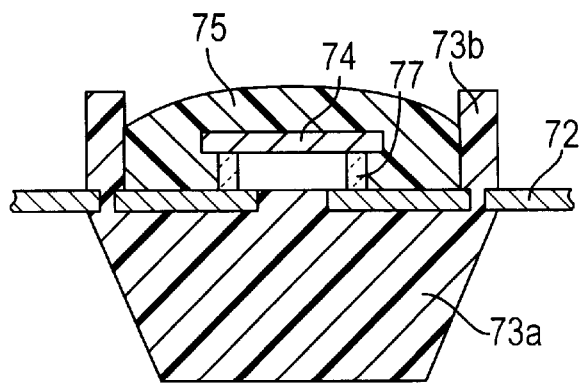

Upon completion of the connection of the projection electrode 77 to the lead frame 72, the sealing resin 75 is dropped into the region surrounded by the bank portion 73b, whereby the chip 74 is sealed (FIG. 12(c)). Thus, a space is formed between the electrode formation surface of the chip 74 and the lead frame 72. The quantity of the sealing resin 75 to be dropped shall seal the chip 74 perfectly when the sealing resin 75 is filled in the region surrounded by the bank portion 73b. Furthermore, these steps should be preferably conducted at a reduced pressure condition, in order to prevent occurrence of cracks in the chip 74.

As described above, the projection electrode 77 formed in the chip 74 faces the lead frame 72, and the chip 74 and the lead frame 72 are connected. Then, the chip 74 is sealed by the dropped sealing resin 75. Thus, the resin mold package having an excellent high frequency characteristic can be obtained, which has the space in the electrode formation surface of the chip 74. Furthermore, although the space facing the electrode formation surface of the chip 74 is formed, the outer surface of the chip 74 is sealed by the sealing resin 75. Therefore, a mechanical strength of the package of this embodiment is excellent. Particularly, by connecting between the substrate portion 73a and the bank portion 73b through the anchor hole 72a, a pulling-up strength of the lead frame 72 is also enhanced. Furthermore, the manufacturing techniques of the conventional resin sealing package can be utilized, without any modification, concerning molding of the base 71 and mounting of the chip 74. Therefore, the high level techniques is not required so much for dropping the sealing resin 75. Therefore, the package of this embodiment of the present invention can be manufactured easily and inexpensively by almost the same manufacturing steps as those of the conventional resin sealing package.

(Eighth Embodiment)

Figure 13A:
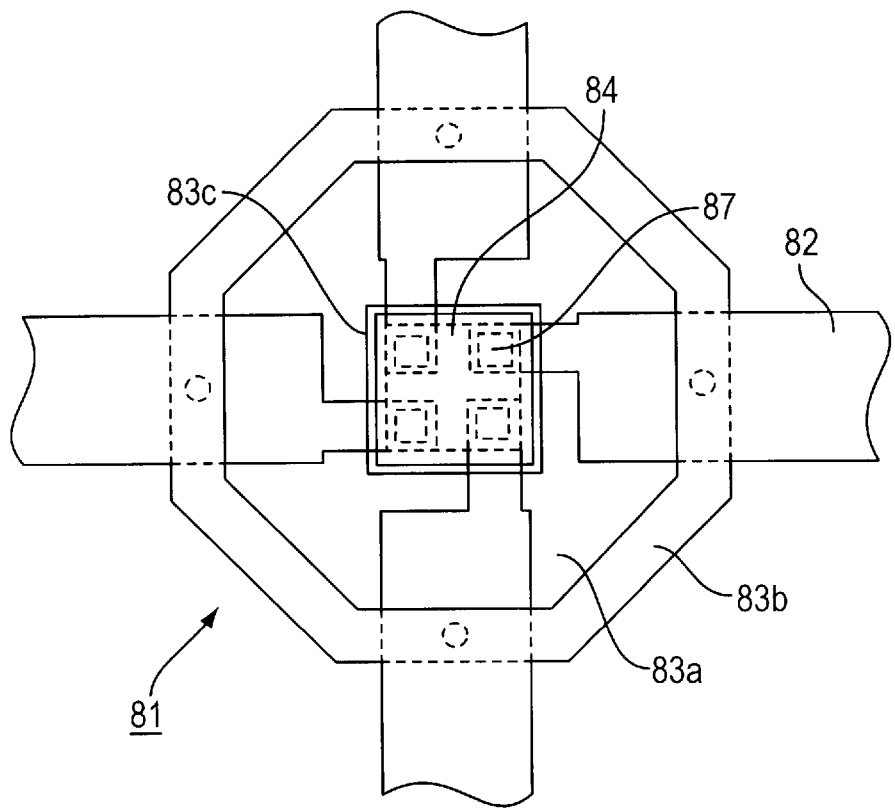
FIG. 13(a) is a plan view showing a package of a eighth embodiment of the present invention before dropping resin for sealing thereon.
Figure 13B:
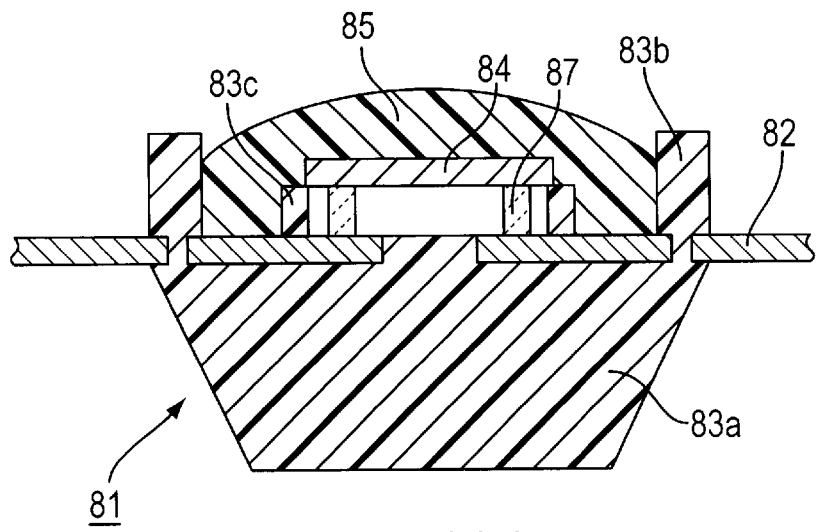
FIG. 13(b) is a sectional view showing the package of the eighth embodiment of the present invention after sealing by resin.

A package of an eighth embodiment of the present invention will be described with reference to FIGS. 13(a) and 13(b).

In the package of this embodiment, a frame-shaped inner side bank portion 83c is arranged on the upper surface of the base 81 and inside the bank portion 83b, in addition to the bank portion 83b. The inner side bank portion 83c is located outside the projection electrode 87, mounting the chip 84 thereon. The electrode formation surface of the chip 84 attaches tightly to the inner side bank portion 83c all over the outer periphery thereof. The inner side bank portion 83c is formed simultaneously when the substrate portion 83a and the bank portion 83b are formed at the time of molding the base 81. In order to attach the upper surface of the inner side bank portion 83c with the electrode formation surface of the chip 84 securely, the height of the inner side bank portion 83c should be preferably larger than the distance between the chip 84 and the lead frame 82. The connection of the projection electrode 87 to the lead frame 82 should not be hindered. Therefore, in this embodiment, the height of the inner side bank portion 83c is set to be larger than the distance between the chip 84 and the lead frame 82 by 5 to 10 μm. Other constitutions of the package of this embodiment is the same as those of the seventh embodiment, and the descriptions for them are omitted.

Figure 14A:
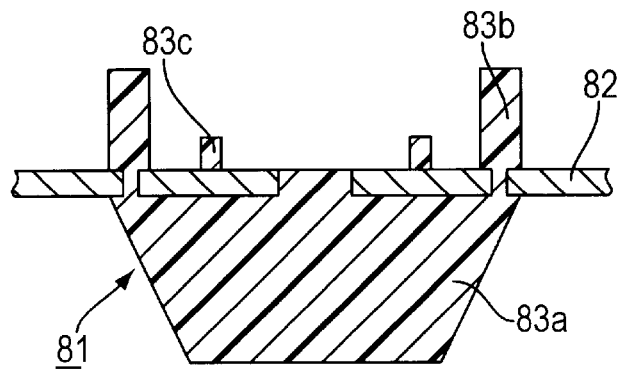
FIGS. 14(a) to 14(c) are figures showing a manufacturing method of the package shown in FIGS. 13(a) and 13(b)
Figure 14B:
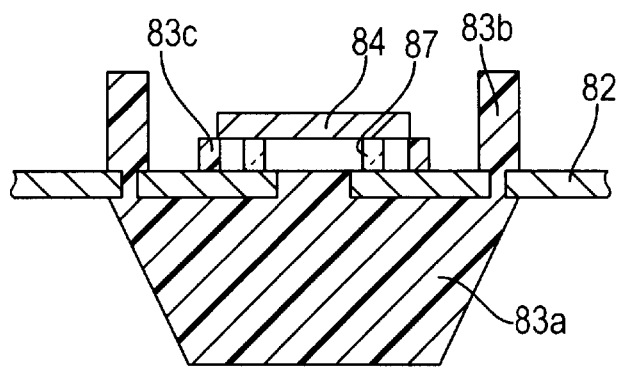

Next, a manufacturing method of the package of this embodiment will be described with reference to FIGS. 14(a) to 14(c).

First, the lead frame 82 which was previously formed in a specified shape by press working or etching processing is disposed within a cavity of a metallic mold (not shown). Resin is injected into the cavity, thereby forming the base 81 consisting of the substrate portion 83a, the bank portion 83b, the inner side bank portion 83c, and the lead frame 82, which are integrated with each other (FIG. 14(a)).

Subsequently, in the same manner as the seventh embodiment, the projection electrode 87 and the lead frame 82 are thermally compressed to be fixed to each other. Thus, the upper surface of the inner side bank portion 83c and outer periphery of the electrode formation surface of the chip 84 are adhered closely, whereby the space formed by the inner side bank portion 83c and the chip 84 is sealed hermetically (FIG. 14(b)).

Figure 14C:
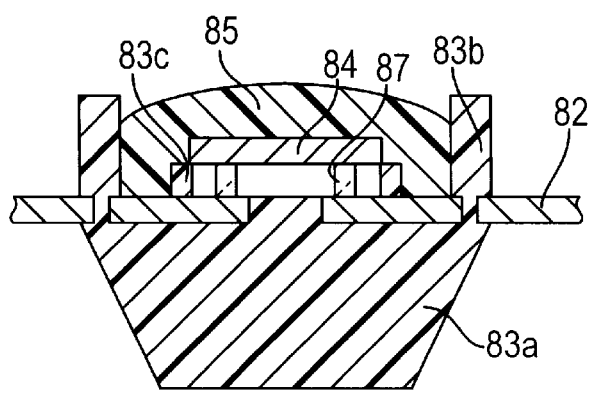

Upon completion of the connection of the projection electrode 87 to the lead frame 82, the sealing resin 85 is dropped in the same manner as the seventh embodiment, whereby the chip 84 is sealed (FIG. 14(c)). At this time, since the inside of the inner side bank portion 83c is sealed hermetically as described above, the sealing resin 85 is prevented from flowing into the inside of the inner side bank portion 83c, whereby the space for the electrode formation surface of the chip 84 can be secured.

In this embodiment, it is possible to prevent the sealing resin 85 from flowing into the electrode formation surface of the chip 84 by means of the inner side bank portion 83c. Therefore, there is no restriction to the viscosity of the sealing resin 85 and the height of the projection electrode 87, which is needed in the seventh embodiment.

As described above, according to the present invention, the principal structure of the package is that the package is made of resin, the chip is sealed in the space formed by the base and the cap, or the chip is sealed in the space formed between the lead frame and the electrode formation surface facing the lead frame. Therefore, the resin mold hollow package having an excellent high frequency characteristic can be obtained.

Among those packages, in the package in which the bank portion is formed on the upper surface and at the periphery of the substrate portion of the base, the anchor portion is formed at the portion of the lead frame interposed between the substrate portion and the bank portion, and the cap is fixed to the bank portion, the strength of the package itself can be increased. Particularly, the pulling-up strength of the lead frame can be also increased by forming the blade portion, the jagged stripe or the nail portion in the lead frame, or by adding the anchor portion obtained by combining them to the lead frame.

Furthermore, in the package in which the bank portion is arranged inside the inner wall of the cap, and the cap is fixed to the outer surface of the bank portion and the edge of the substrate portion, not only the strength of the package itself but also the fixing strength of the cap can be increased by the bank portion. In addition, the bank portion serves as a guide for the cap, whereby the accuracy in positioning at the time of fixing the cap to the base can be increased.

Furthermore, in the package in which the lead frame is bent in a convex shape so as to expose its chip mounting portion and bonding portion to the surface of the substrate portion, and the lead frame is projected from the side surface of the substrate portion, the pulling-up strength of the lead frame can be increased without formation of the bank portion. In this case, by making the upper surface of the lead frame flat, flashes of the resin occurred in the surface of the lead frame at the time of formation of the base will be easily removed.

Furthermore, in the package in which the chip having a plurality of projection electrodes with the electrode formation surface facing the lead frame of the base is connected to the lead frame, and the chip is sealed with the sealing resin dropped from the above, it is possible to increase the strength of the package itself by the sealing resin. Particularly, the formation of the inner side bank portion in the base prevents the sealing resin from flowing into the space between the chip and the lead frame and makes the secure formation of this space possible.

Although the preferred embodiment of the present invention has been described in detail, it should be understood that various changes, substitutions and alterations can be made therein without departing from spirit and scope of the inventions as defined by the claims.

What is claimed is:

1. A package comprising: a base including a lead frame, a substrate portion sealing said lead frame therein, a framed-shaped bank portion formed at an outer periphery of an upper surface of said substrate portion, said bank portion having said lead frame interposed between said bank portion and the substrate portion, and an anchor portion formed in a portion of said lead frame interposed between said substrate portion and said bank portion, said substrate portion and said bank portion being formed integrally with said lead frame by resin, said lead frame extending out of said substrate portion for bending; a chip electrically connected to said lead frame and mounted on a region of said lead frame on said base, said region being surrounded by said bank portion; and a hollow-shaded cap made of a resin covering said chip, said cap being fixed onto said bank portion, wherein said hollow-spaped cap and base form a hollow cavity for housing said chip, wherein said anchor portion is an anchor hole formed at a portion of said lead frame interposed between said substrate portion and said bank portion, said anchor hole connects said substrate portion to said bank portion.

2. A package comprising: a base including a lead frame, a substrate portion sealing said lead frame therein, a framed-shaped bank portion formed at an outer periphery of an upper surface of said substrate portion, said bank portion having said lead frame interposed between said bank portion and the substrate portion, and an anchor portion formed in a portion of said lead frame interposed between said substrate portion and said bank portion, said substrate portion and said bank portion being formed integrally with said lead frame by resin, said lead frame extending out of said substrate portion for bending; a chip electrically connected to said lead frame and mounted on a region of said lead frame on said base, said region being surrounded by said bank portion; and a hollow-shaded cap made of a resin covering said chip, said cap being fixed onto said bank portion, wherein said hollow-spaded cap and base form a hollow cavity for housing said chip, wherein said anchor portion consists of an anchor hole and a blade portion, said anchor portion being formed at a portion of said lead frame interposed between said substrate portion and said bank portion and connecting said substrate portion to said bank portion, and said blade portion projects toward a direction of a thickness of said lead frame.

3. The package according to claim 2, wherein said blade portion projects toward a side surface of said bank portion.

4. A package comprising: a base including a lead frame, a substrate portion sealing said lead frame therein, a framed-shaped bank portion formed at an outer periphery of an upper surface of said substrate portion, said bank portion having said lead frame interposed between said bank portion and the substrate portion, and an anchor portion formed in a portion of said lead frame interposed between said substrate portion and said bank portion, said substrate portion and said bank portion being formed integrally with said lead frame by resin, said lead frame extending out of said substrate portion for bending; a chip electrically connected to said lead frame and mounted on a region of said lead frame on said base said region being surrounded by said bank portion; and a hollow-shaped made of a resin covering said chip, said cap being fixed onto said bank poriton, wherein said hollow-spaded cap and base form a hollow cavity for housing said chip, wherein said anchor portion, which is formed at a portion of said lead frame interposed between said substrate portion and said bank portion, consists of an anchor hole and jagged stripes, said anchor hole connecting said substrate portion to said bank portion and said jagged stripes having tops and bottoms alternately arranged along a direction of a width of said lead frame.

5. A package comprising: a base including a lead frame, a substrate portion sealing said lead frame therein, a framed-shaped bank portion formed at an outer periphery of an upper surface of said substrate portion, said bank portion having said lead frame interposed between said bank portion and the substrate portion, and an anchor portion formed in a portion of said lead frame interposed between said substrate portion and said bank portion, said substrate portion and said bank portion being formed integrally with said lead frame by resin, said lead frame extending out of said substrate portion for bending; a chip electrically connected to said lead frame and mounted on a region of said lead frame on said base, said region being surrounded by said bank portion; and a hollow-shaded cap made of a resin covering said chip, said cap being fixed onto said bank portion, wherein said hollow-shaped cap and base form a hollow cavity for housing said chip, wherein said anchor portion consists of an anchor hole and a nail portion formed at a portion of said lead frame interposed between said substrate portion and said bank portion, said anchor hole connecting said substrate portion to said bank portion.

6. The package according to claim 5, wherein said nail portion displays a tapering wedge shape with a top end extending toward an outside of said base.

7. A package comprising: a base including a lead frame, a substrate portion sealing said lead frame therein, a framed-shaped bank portion formed at an outer periphery of an upper surface of said substrate portion, said bank portion having said lead frame interposed between said bank portion and the substrate portion, and said substrate portion and said bank portion being formed integrally with said lead frame by resin; a chip electrically connected to said lead frame and mounted on a region of said lead frame on said base, said region being surrounded by said bank portion; a cap made of resin covering said chip, said cap being fixed onto said bank portion: wherein said bank portion is arranged inside an inner wall of said cap is fixed to an edge of said substrate portion and an outer wall surface of said bank portion, wherein an anchor portion is provided at a portion of said lead frame interposed between said substrate portion and said bank portion, wherein said anchor portion is an anchor hole formed in said lead frame, said anchor hole formed in said lead frame, said anchor hole connecting said substrate portion to said bank portion, wherein said anchor portion is an anchor hole formed in said lead frame, said anchor hole connecting said substrate portion to said bank portion.

8. A package comprising: a base including a lead frame, a substrate portion sealing said lead frame therein, a framed-shaped bank portion formed at an outer periphery of an upper surface of said substrate portion, said bank portion having said lead frame interposed between said bank portion and the substrate portion, and substrate portion and said bank portion being formed integrally with said frame by resin; a chip mounted on a region surrounded by said bank portion in said lead frame on said base, said chip being electrically connected to said lead frame, wherein said chip, which has a plurality of projection electrodes on its electrode formation surface facing said lead frame, is connected to said lead frame and is sealed with dropped resin, and a space is provided between said chip and said substrate portion, wherein said lead frame extends from said substrate portion for bending, wherein said inner side bank portion is made of resin and said inner side bank portion is molded simultaneously together with said substrate portion and said bank portion, wherein said lead frame has an anchor portion formed at a position interposed between said substrate portion and said bank portion, said anchor portion is an anchor hole formed in said lead frame, said anchor hole connecting said substrate portion to said bank portion.

9. A semiconductor device comprising:

a resin base including a substrate portion and a bank portion projected on said substrate portion in a frame shape to define a first surface portion at said substrate portion;

a lead including a first portion arranged on a part of said first surface portion of said substrate portion and a second portion continuously extending from said first portion and interposed between said substrate portion and said bank portion;

a chip provided over said first surface portion of said substrate portion and having an electrode electrically connected to said first portion of said lead; and an anchor hole selectively formed in said second portion of said lead to join respective parts of said substrate portion and said bank portion to each other.

10. The semiconductor device according to claim 9, wherein a blade portion projecting toward a direction of a thickness of said lead is formed at said second portion of said lead.

11. The semiconductor device according to claim 9, wherein jagged stripes having tops and bottoms alternately arranged along a direction of a width of said lead are formed at said second portion of said lead.

12. The semiconductor device according to claim 9, wherein a nail portion is formed at said second portion of said lead.

13. The semiconductor device according to claim 9, wherein a cap made of resin covering said chip is fixed onto said resin base, and said bank portion is arranged inside an inner wall of said cap.

14. The semiconductor device according to claim 9, wherein said electrode of said chip is a projection electrode formed on an electrode formation surface of said chip facing said first surface portion of said substrate portion, said projection electrode being connected to said first portion of said lead, and said chip being sealed with dropped resin.

15. The semiconductor device according to claim 14, wherein a frame-shaped inner side bank portion is formed over said first surface portion of said substrate portion, said inner bank portion being located at a position between said bank portion and said projection electrode and being fixed to all portion of an outer periphery of said electrode formation surface of said chip.

16. A semiconductor device comprising:
   a resin base having a surface portion;
   a lead including a first portion arranged on a part of said surface portion of said resin base and a second portion continuously extending from said first portion and buried in said resin base;
   a chip provided over said surface portion of said resin base and having an electrode electrically connected to said first portion of said lead; and
   an anchor hole selectively formed at said second portion of said lead and filled with material of said resin base.

* * * * *